(12) United States Patent
Chaji et al.

(10) Patent No.: US 12,237,236 B2
(45) Date of Patent: Feb. 25, 2025

(54) CARTRIDGE FOR INSPECTION

(71) Applicant: VueReal Inc., Waterloo (CA)

(72) Inventors: Gholamreza Chaji, Waterloo (CA);
Ehsanollah Fathi, Waterloo (CA);
Hossein Zamani Siboni, Waterloo
(CA); David Hwang, Waterloo (CA)

(73) Assignee: VueReal Inc., Waterloo (CA)

( * ) Notice: Subject to any disclaimer, the term of this patent is extended or adjusted under 35 U.S.C. 154(b) by 141 days.

(21) Appl. No.: 18/005,418

(22) PCT Filed: Jul. 15, 2021

(86) PCT No.: PCT/CA2021/050977
§ 371 (c)(1),
(2) Date: Jan. 13, 2023

(87) PCT Pub. No.: WO2022/011473
PCT Pub. Date: Jan. 20, 2022

(65) Prior Publication Data
US 2023/0260856 A1    Aug. 17, 2023

Related U.S. Application Data

(60) Provisional application No. 63/051,931, filed on Jul. 15, 2020.

(51) Int. Cl.
*H01L 21/66*     (2006.01)
*G01R 1/04*      (2006.01)
*H01L 23/28*     (2006.01)
*H01L 23/48*     (2006.01)
*H01L 29/15*     (2006.01)

(52) U.S. Cl.
CPC ............ *H01L 22/32* (2013.01); *G01R 1/0416* (2013.01); *H01L 23/28* (2013.01); *H01L 23/481* (2013.01); *H01L 29/157* (2013.01)

(58) Field of Classification Search
CPC ....... H01L 22/32; H01L 23/28; H01L 23/481; H01L 29/157; G01R 1/0416; G01R 3/00
See application file for complete search history.

(56) References Cited

U.S. PATENT DOCUMENTS

| | | | |
|---|---|---|---|
| 8,518,204 B2 | 8/2013 | Hu et al. | |
| 2003/0111441 A1 | 6/2003 | Jerominek et al. | |
| 2007/0070311 A1 | 3/2007 | Bijnen et al. | |
| 2018/0358405 A1* | 12/2018 | Chaji | H01L 24/92 |
| 2019/0280050 A1* | 9/2019 | Chaji | H10K 59/878 |
| 2020/0013908 A1* | 1/2020 | Yi | H01L 31/02164 |
| 2020/0091388 A1* | 3/2020 | Chaji | H01L 33/20 |

OTHER PUBLICATIONS

WIPO: PCT International Search Report and Written Opinion relating to PCT application No. PCT/CA2021/050977, dated Nov. 2, 2021.

* cited by examiner

*Primary Examiner* — Herve-Louis Y Assouman

(57) ABSTRACT

The present invention relates to the inspection process which includes providing access to the microdevice contacts, measuring the microdevice and analyzing the data to identify defects or performance of the micro device. The invention also relates to the forming of test electrodes on microdevices. The test electrodes may be connected to hidden contacts. The type of microdevices may be vertical, lateral or a flip chip.

21 Claims, 8 Drawing Sheets

CARTRIDGE FOR INSPECTION

BACKGROUND AND FIELD OF THE INVENTION

The present invention relates to the inspection process which includes providing access to the microdevice contacts, measuring the microdevice and analyzing the data to identify defects or performance of the micro device.

SUMMARY

The present invention relates to a method of forming test electrodes for vertical microdevice, the method comprising, forming a microdevice on a microdevice substrate, the microdevice having a hidden contact on a surface facing away from the microdevice substrate, forming a protection layer to cover a part of the hidden contact, forming a dielectric layer to cover a surface of the microdevice and at least part of the microdevice sidewall, forming an opening to provide access to the hidden contact and forming an electrode to provide access to the hidden contact outside of the microdevice.

The present invention also relates to a method of forming test electrodes for a flip chip microdevice, the method comprising, forming a microdevice on a microdevice substrate, forming a dielectric layer to cover a surface of the microdevice and at least part of a microdevice sidewall, forming a release layer on the microdevice, forming common layers on top of the microdevice, covering the common layers by the dielectric, forming an opening on at least one side within the microdevice with the dielectric covering the sidewalls of the opening, filling a part of the opening with a conductive layer, forming a frame around the microdevice with a thicker dielectric, removing the microdevice substrate and common layers and having more than one contact facing away from a cartridge substrate.

The present invention also relates to a method of forming test electrodes for a lateral microdevice, the method comprising, forming a microdevice on a microdevice substrate, forming a first dielectric layer to cover a first surface of the microdevice and at least part of a microdevice sidewall, wherein the first surface is a p-type or n-type and an ohmic is on a top of the first surface, forming an opening provide access to a part of the first surface of the microdevice facing away from the microdevice substrate, covering sidewalls of the opening with the first dielectric, forming test electrodes the first surface, coupling a first test electrode to the first surface through the opening in the first dielectric, coupling a second electrode to a contact layer on a surface of the microdevice facing the microdevice substrate and opening the dielectric to provide access to the other contact layer of the microdevice.

The present invention also relates to a method of forming test electrodes for a flip chip microdevice, the method comprising, forming a microdevice on a microdevice substrate, forming a dielectric layer to cover a surface of the microdevice and at least part of a microdevice sidewall, forming a release layer on the microdevice, covering the transfer layers by the dielectric, forming an opening on at least one side within the microdevice with the dielectric covering the sidewalls of the opening, forming electrodes on a top surface of the microdevice, patterning the electrodes so they are coupled to each contact individually, forming an ohmic structure is formed on a top contact of the microdevice, forming transfer layers on top of the microdevice, removing the microdevice substrate and transfer layers, and having more than one contact facing away from a cartridge substrate.

The present invention also relates to a method of forming test electrodes for a lateral microdevice, the method comprising, forming a microdevice on a microdevice substrate, forming a first dielectric layer to cover a first surface of the microdevice and at least part of a microdevice sidewall, wherein the first surface is a p-type or n-type and an ohmic is on a top of the first surface, forming an opening provide access to a part of the first surface of the microdevice facing away from the microdevice substrate, covering sidewalls of the opening with the first dielectric, forming electrodes on a bottom surface of the microdevice, patterning the electrodes so they are coupled to each contact individually, forming transfer layers on top of the microdevice, opening the dielectric to provide access to the electrodes, removing the microdevice substrate and transfer layers, and bonding the microdevice to cartridge substrate.

BRIEF DESCRIPTION OF THE DRAWINGS

The foregoing and other advantages of the disclosure will become apparent upon reading the following detailed description and upon reference to the drawings.

Figure 1A:
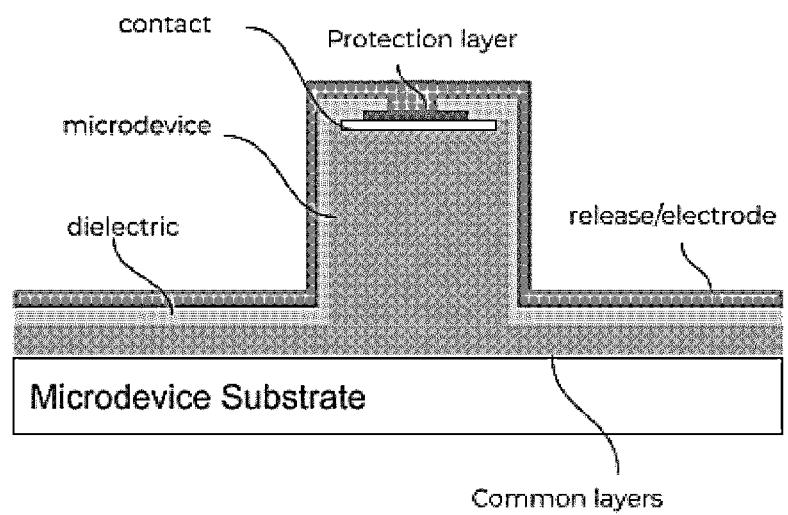
FIG. 1A shows a vertical microdevice formed on a microdevice substrate.
Figure 1B:
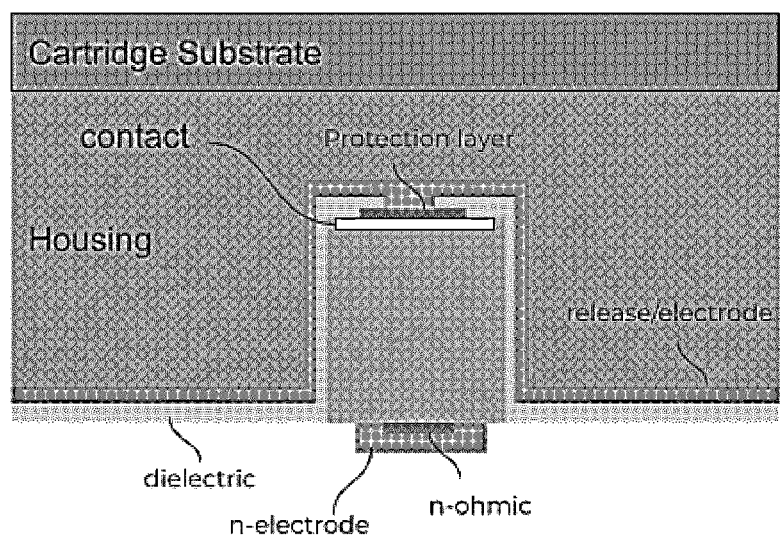
FIG. 1B, shows the device is bonded to a cartridge.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

In this description, the terms "device" and "microdevice" are used interchangeably. However, it is clear to one skilled in the art that the embodiments described here are independent of the device size.

The present invention relates to the inspection process which includes providing access to the microdevice contacts, measuring the microdevice and analyzing the data to identify defects or performance of the microdevice.

In one case, providing access to the microdevice includes forming test electrodes coupled to the hidden contacts (e.g. vertical, lateral, or flip chip) before transferring to a cartridge substrate. In another related case forming test electrodes for accessible contacts (e.g. vertical, lateral, or flip chip). The hidden contacts are the bias point in a microdevice where it is facing the substrate and cannot be accessed from the surface.

A flip chip device has at least two contacts on the surface facing away from a substrate. A vertical device has at least one contact facing the substrate and one contact facing away from the substrate. A lateral device has at least two contacts facing the substrate.

In another case an opening is formed to provide access to the test electrode coupled to the hidden contacts of a microdevice (e.g. p for vertical and p,n for lateral).

In another aspect, the devices in a cartridge (or donor substrate) are measured through the test electrodes. The measurement can be electrical or electrical and optical.

After measurement, at least one test electrode is removed or isolated for microdevices.

In another case, the test electrode is isolated from the microdevice during the transfer process where the microdevice is placed in a system substrate from the cartridge (or donor) substrate.

In another case, after measurement or electrode isolation, pads are formed on the devices enabling bonding of microdevices into a system substrate.

The pads can be formed prior to the measurement process as well. A protection layer can be formed on top of the pads so that the pads do not get damaged/deformed prior to transfer during the measurement process.

In another related embodiment, the pads are formed, and the electrodes are formed and isolated after measurement. In this case, removing the electrode enables pads for bonding. In one case, the pads can be Gold and the electrodes can be Aluminum. Removing Aluminum after measurement cleans the surface of the pads and enables them for bonding.

The microdevices can have top surface and bottom surface. The top surface is facing away from the substrate and the contacts on that surface are accessible. The bottom surface is facing the substrate and covered by other layers and the contacts at that surface are hidden. The embodiments here describe methods of providing access to both hidden and accessible contact in one device. In one case, an electrode is formed on the surface of the microdevice substrate. The electrode is coupled to the hidden contact through an opening in the dielectric covering the contact. The wafer is then bonded to another substrate and the donor substrate is removed. Then the dielectric is removed to provide access to the electrode of the hidden contact. Another electrode may get deposited on the second surface of the device exposed by removing the microdevice wafer. The second electrode can be connected to the accessible contact through an opening in a second dielectric on top of the second surface. The patterned part of the second electrode can also connect to the first electrode through the opening in the dielectric covering the first electrode.

FIG. 1 shows an exemplary embodiment of a structure and a method of forming test electrodes for a vertical device with at least one hidden contact. In one related embodiment a release layer is used. As highlighted in FIG. 1A, the microdevice is formed on a microdevice substrate. The microdevice has at least one contact on the surface facing away from the microdevice substrate. A protection or contact layer can be formed to cover part of the contact. The contact can be a combination of an ohmic layer and doped layers. It can be either a p-doped or n-doped layer. A dielectric layer is formed to cover the surface of the microdevice and at least part of the device sidewall. An opening is formed to provide access to the contact (or protective layer). An electrode is formed to bring the access to the microdevice contact to the outside area of the microdevice. The electrode can also act as a release layer or other layers can be formed on top of the electrode as release layers. There can be some common layers also on top of the substrate. The dielectric can cover the common layers as well. As shown in FIG. 1B, the device is bonded to a cartridge (donor substrate). Prior to bonding or during the bonding a housing layer(s) can form around the device. The microdevice substrate is then removed and common layers can be etched back (or removed by other means). Here, the device can have a top contact facing away from the cartridge substrate. An ohmic structure can form on the contact point of the device. The ohmic can be either n-type or p-type. An electrode is formed to provide access to the top contact. In this example, the electrode is n-electrode coupled to the top n-ohmic (it can be p-electrode in another case). A dielectric can form on the top surface of the microdevice prior to the formation of n-electrode or n-ohmic. In this case an opening can be formed to provide access to the device top contact or n-ohmic.

Figure 1C:
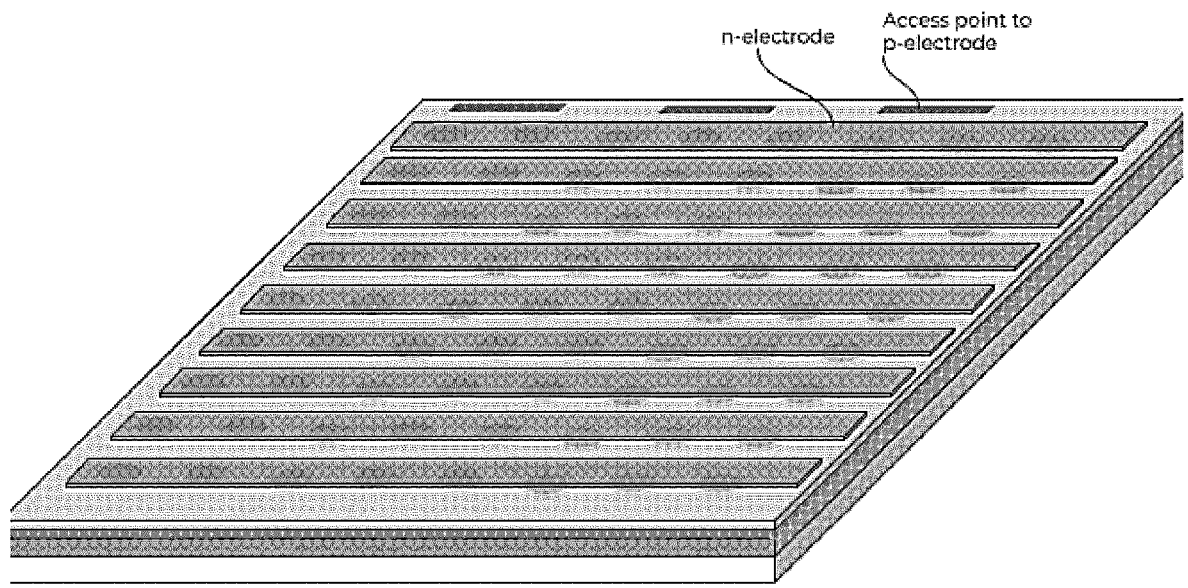
FIG. 1C shows a top view of a cartridge or donor substrate with electrode for hidden contact and electrode for top contact.

FIG. 1C shows a top view of a cartridge or donor substrate with an electrode for hidden contact and an electrode for top contact. The electrodes can be coupled to more than one microdevice. In one case, the electrodes can form rows and columns. In another case they can form either row or column. To have access to the electrode for the hidden contact(s), the dielectric is patterned (or removed from a part of the test electrode). Here p-electrode is coupled to the hidden contacts and n-electrode is coupled to the top contacts (the n and p electrode can be replaced, or other functional electrodes can be developed depending on the type of microdevice).

After the measurement is performed, the top electrode (n-electrode) can be patterned or removed to isolate each microdevice. Pads can form on the top contact. In another case, the n-electrode can be left on the substrate.

Prior to the transfer of microdevices from cartridge to another substrate (system substrate), the electrode of the hidden contact also can be isolated or removed. This process can be the same as removing the release layer. It can be done either chemically, thermally, or optically.

Figure 1D:
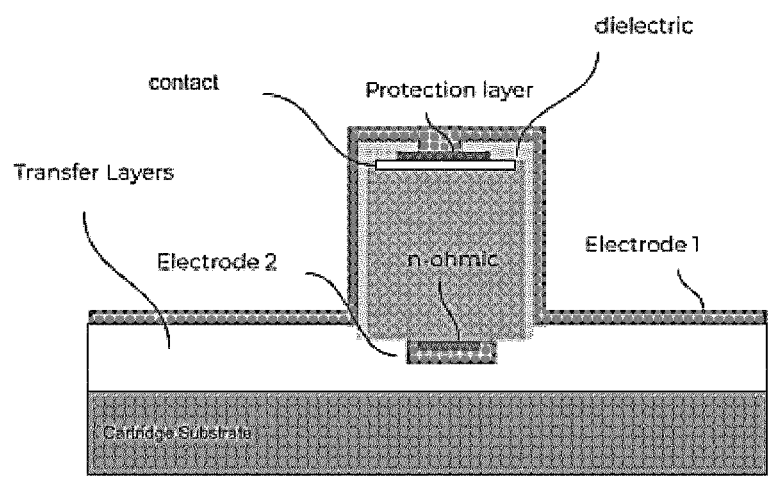
FIG. 1D shows another related embodiment of devices with two types of contacts.

FIG. 1D shows another related embodiment of devices with two types of contacts (hidden and accessible contacts). Here, transfer layers are formed after or at the same time as forming the 2nd electrode to contact the hidden contact. After the devices are separated from the main substrate (one example in FIG. 1B), the second electrode (electrode 2) is formed and other layers such as membrane, anchors, release layer, force layer, buffer layers (called transfer layer) are formed. The devices are bonded to another substrate called cartridge substrate.

FIG. 1 examples show related embodiments of microdevices by two types of contacts (hidden and accessible contacts). One electrode connects to the hidden electrode and is separated from the other electrode connecting to the accessible electrode by at least a dielectric layer. The dielectric layer is patterned to provide access to the electrode connected to the hidden contact. The electrode can be on a planarized layer, or they can cover the side of the device.

FIG. 2 shows an exemplary embodiment of a structure and a method of forming test electrodes for a flip chip device with no hidden contact. Here, all contacts are accessible from the top surface. In one embodiment a release layer is used. As highlighted in FIG. 2A, the microdevice is formed on a microdevice substrate. A dielectric layer can be formed to cover the surface of the microdevice and at least part of the device sidewall. A release layer can be formed to facilitate the further integration process. There can be some common layers also on top of the substrate. The dielectric can cover the common layers as well. This embodiment works with different flip chip device structures such as double mesa, corner mesa, side contact traces, and other methods. Here we use the VIA through structure to explain the embodiment. There can be a VIA formed that at least one side of it is within the microdevice. The dielectric can also cover the sidewalls of the VIA. A conductive layer can fill at least part of the VIA. The VIA can be partially filled with another layer. A frame can be formed around the device with a thicker dielectric. Or the thicker dielectric can be only on the surface of the device facing away from the microdevice substrate. The frame can be applied to other embodiments presented here as well. As shown in FIG. 2B, the device is bonded to a cartridge (donor) substrate. Prior to bonding or during the bonding a housing layer(s) can form around the device. The microdevice substrate is removed and the common layers are etched back or removed by other means. Here, the device can have more than one contact facing away from the cartridge substrate. An ohmic structure can form on one of the contact points of the device. The other contract point is coupled to the other side of the device using the VIA formed before (the VIA can also be formed after the device is transferred into the cartridge substrate). The top ohmic can be either n-type or p-type. An electrode is formed to provide access to the top contact. Another electrode is formed to provide access to the VIA. In this example, one of the electrodes is n-electrode coupled to the top n-ohmic (it can be p-electrode in another case) and the other electrode is p-electrode. A dielectric can form on the top surface of the microdevice prior to the formation of electrodes or n-ohmic. In this case an opening can be formed to provide access to the device top contact or n-ohmic.

Figure 2A:
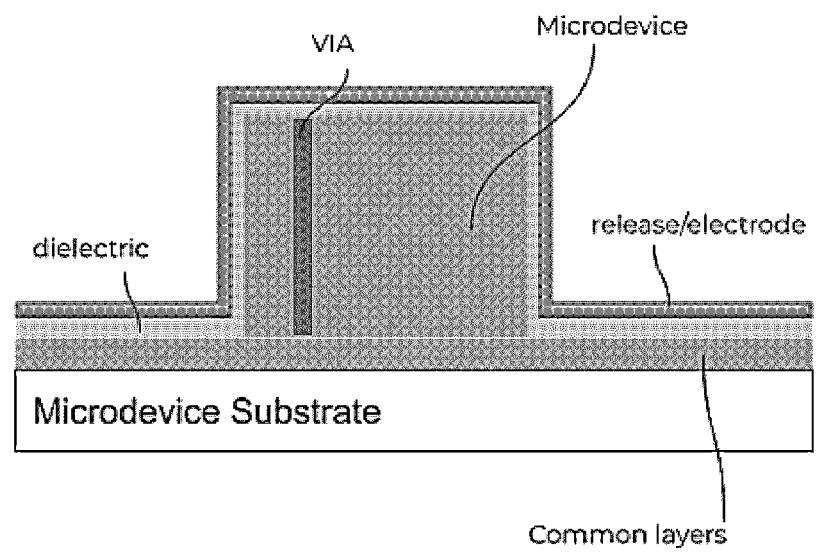
FIG. 2A shows a flip chip microdevice formed on a microdevice substrate.
Figure 2B:
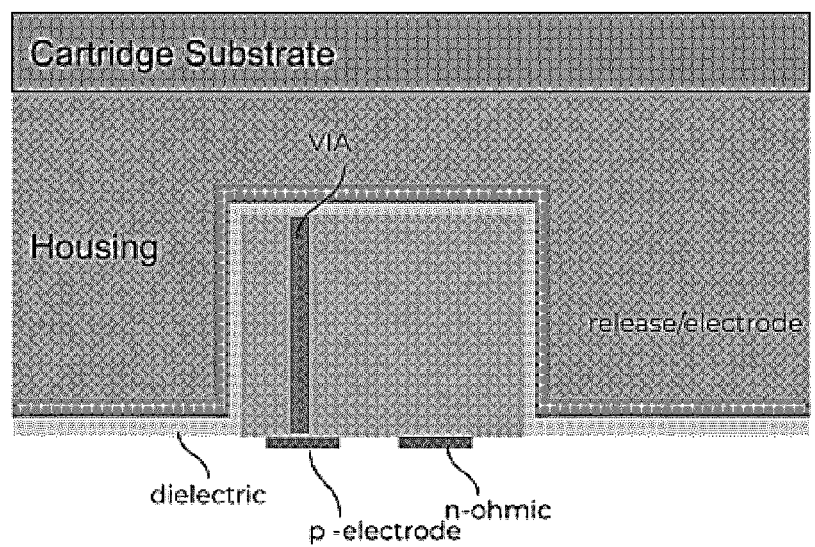
FIG. 2B shows a flip chip micro device bonded to a cartridge.
Figure 2C:
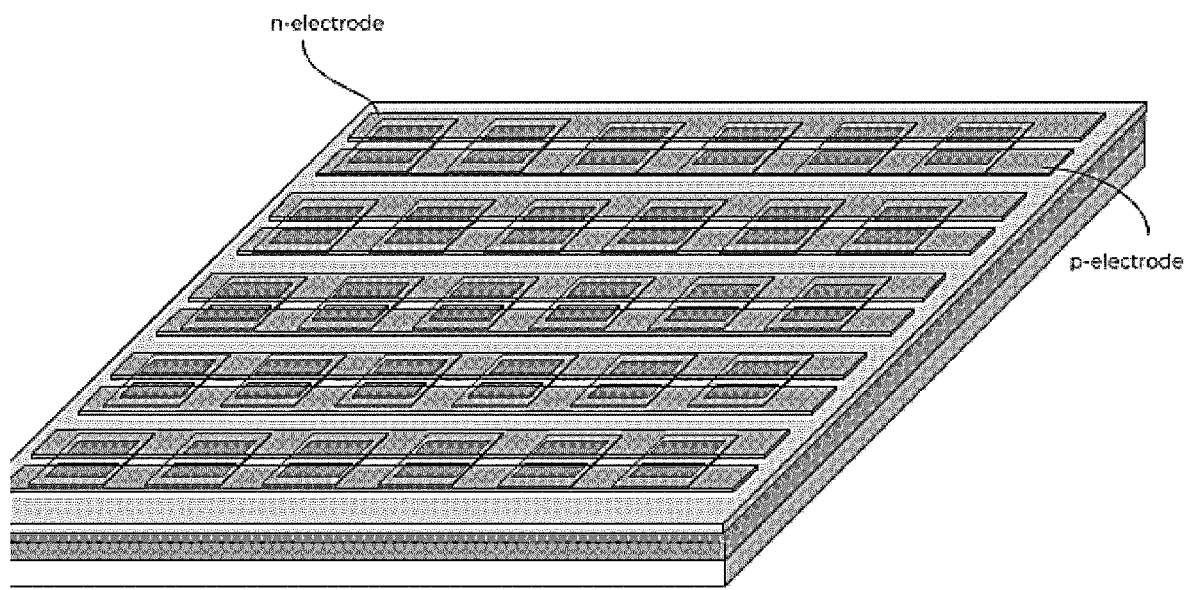
FIG. 2C shows a top view of a cartridge or donor substrate with two electrodes for top contact.

FIG. 2C shows a top view of a cartridge or donor substrate with two electrodes for top contact. The electrodes can be coupled to more than one microdevice. In one case, the electrodes can form rows and columns. In this case, a dielectric is needed to be used between the n and p electrodes to prevent shorting at the crossing points. In another case they can form either row or column (shown in FIG. 2C).

Figure 2D:
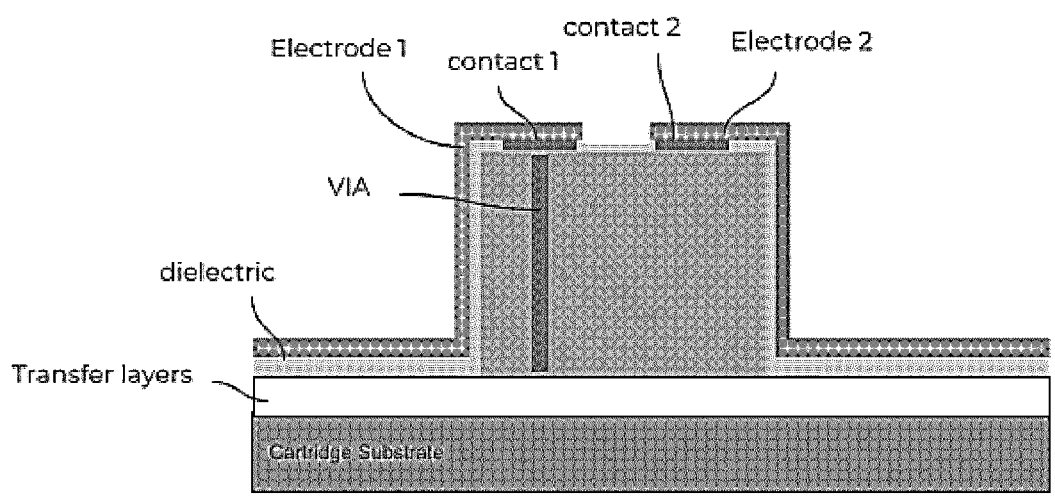
FIG. 2D shows another related example of the flip chip with accessible contacts.

FIG. 2D shows another related example of the flip chip with accessible contacts. Here the electrodes are formed on the top surface of the devices and patterned so they are coupled to each contact individually. The electrodes are coupled to the contacts through opening in a dielectric layer on top of the contacts. After the electrodes are formed on top, a microdevice substrate (e.g., FIG. 2B) is formed and other layers such as membrane, anchors, release layer, force layer, buffer layers (called transfer layer) are formed. The devices are bonded to another substrate called cartridge substrate.

Figure 2E:
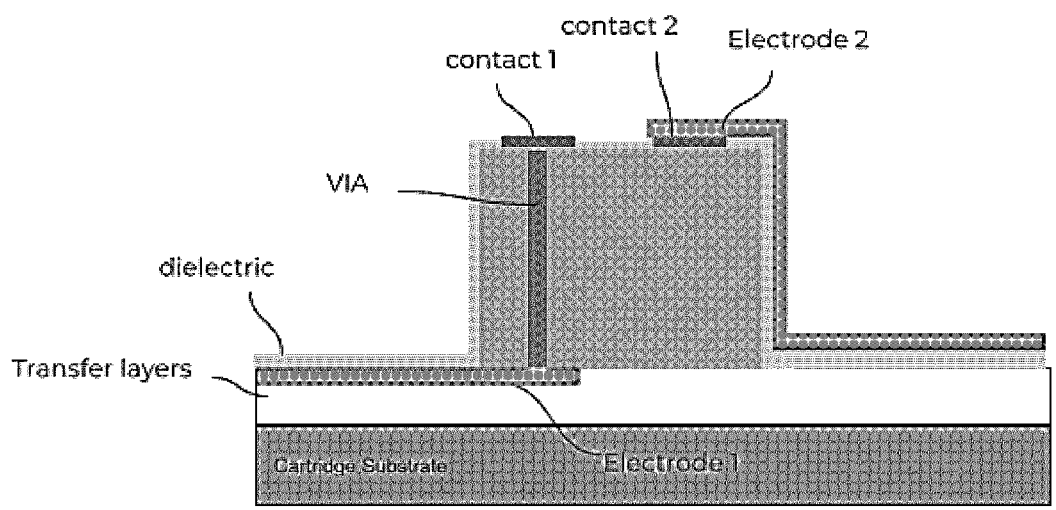
FIG. 2E shows an example of a flip chip where the electrode to one contact is done through a hidden connection.

FIG. 2E is an example of a flip chip where the electrode to one contact is done through a hidden connection. This is done through a VIA contact in the device. The benefit of this structure is that the two electrodes are more isolated through the dielectric layer. This can also allow forming rows and columns structure with electrodes which can enable more control on testing the devices (down to individual devices).

After the measurement is performed, the top electrodes can be patterned or removed to isolate each microdevice. Pads can form on the top contact. In another case, the electrodes can be left on the substrate.

Prior to the transfer of microdevices from cartridge to another substrate (system substrate), the release layer is removed. It can be done either chemically, thermally, or optically.

FIG. 3 shows an exemplary embodiment of a device structure and a method of forming test electrodes for a lateral device with no contact that can be accessed directly. In one embodiment a release layer is used. As highlighted in FIG. 3A, the microdevice is formed on a microdevice substrate. A dielectric layer (dielectric 1) can be formed to cover the surface of the microdevice and at least part of the device sidewall. A VIA can form to provide access to the surface facing away from the microdevice substrate. This surface can be p-type or n-type or other type of functional layer. There can be an ohmic layer on the top of this surface. Test electrodes are formed on the surface. One of the electrodes coupled to the top surface through the opening in the dielectric 1. The second electrode is coupled to the other contact layer that can be at the other surface of the device facing the substrate. The sidewall of the VIA is covered by dielectric. The dielectric can be open to provide access to the other contact of the microdevice. A release layer can be formed to facilitate the further integration process. The release layer can be formed on another dielectric layer (dielectric layer 2). The electrode can act as release layers as well. There can be some common layers also on top of the substrate. The dielectric 1 or dielectric 2 can cover the common layers as well. There can be a VIA formed that at least one side of it is within the microdevice. The dielectric can also cover the sidewalls of the VIA. A conductive layer can fill at least part of the VIA. The VIA can be partially filled with another layer. A frame can be formed around the device with a thicker dielectric. Or the thicker dielectric can be only on the surface of the device facing away from the microdevice substrate. The frame can be applied to other embodiments presented here as well. The frame can be part of dielectric 2 or it can separate layers. As shown in FIG. 3B, the device is bonded to a cartridge (donor) substrate. Prior to bonding or during the bonding a housing layer(s) can form around the device. The microdevice substrate is removed and the common layers are etched back or removed by other means. Here, the device can have more than one contact facing away from the cartridge substrate. An ohmic structure can form on one of the contact points of the device. The other contact point is coupled to the other side of the device using the VIA formed before (the VIA can also be formed after the device is transferred into the cartridge substrate). If the conductive layer in the VIA is not coupled to the microdevice contact point another layer can be deposited after the device is transferred to the cartridge substrate. The new layer can also be a top ohmic.

Figure 3A:
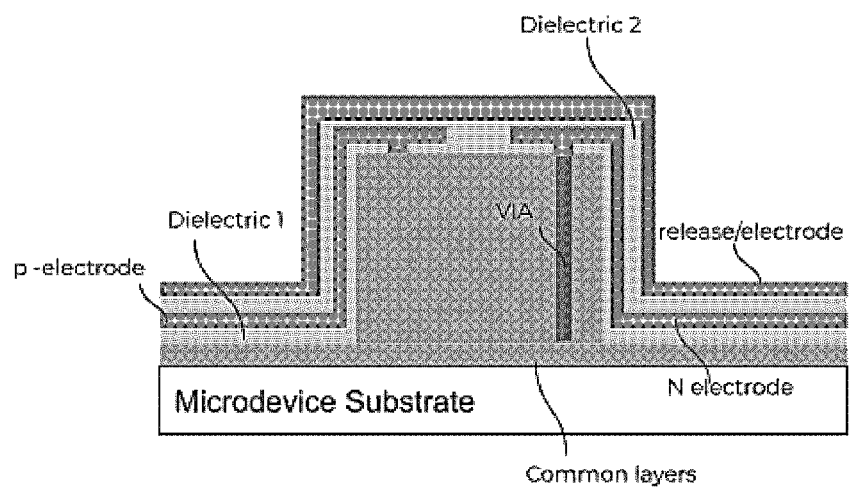
FIG. 3A shows a lateral microdevice formed on a microdevice substrate.
Figure 3B:
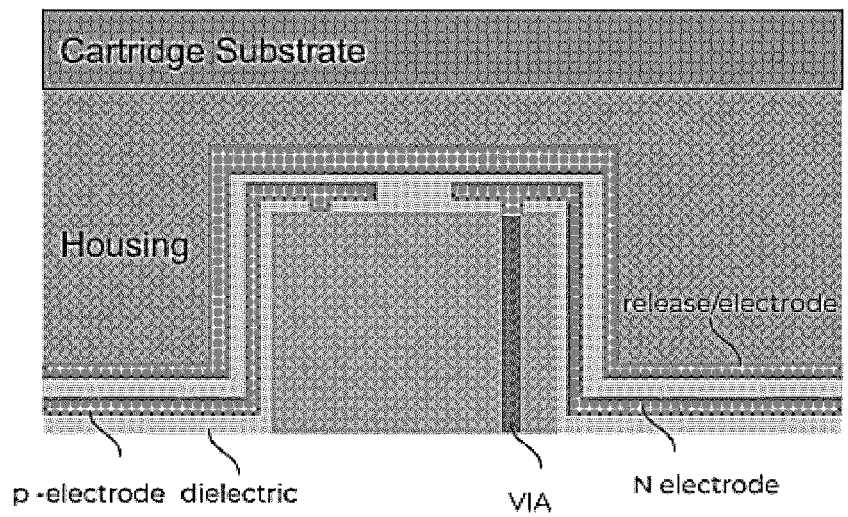
FIG. 3B shows the device bonded to a cartridge substrate.
Figure 3C:
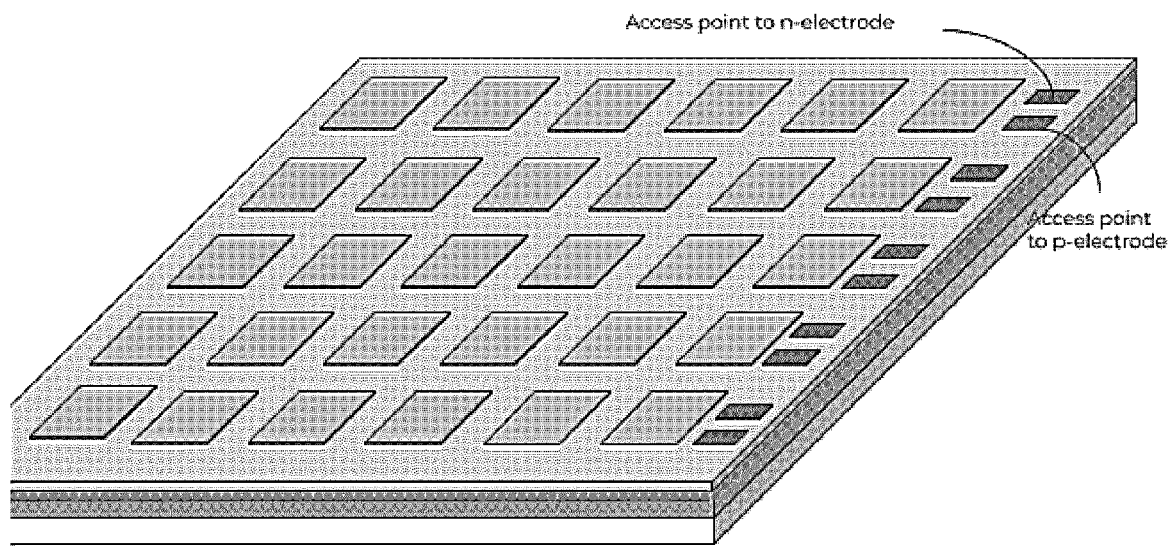
FIG. 3C shows a top view of a cartridge or donor substrate with two electrodes for the hidden contacts.

FIG. 3C shows a top view of a cartridge or donor substrate with two electrodes for the hidden contacts. The electrodes can be coupled to more than one microdevice. In one case, the electrodes can form rows and columns. In this case, a dielectric is needed to be used between the n and p electrodes to prevent shorting at the crossing points. In another case they can form either row or column (shown in FIG. 3C). Here, the dielectric needs to be patterned and open to provide access to the two test electrodes.

Figure 3D:
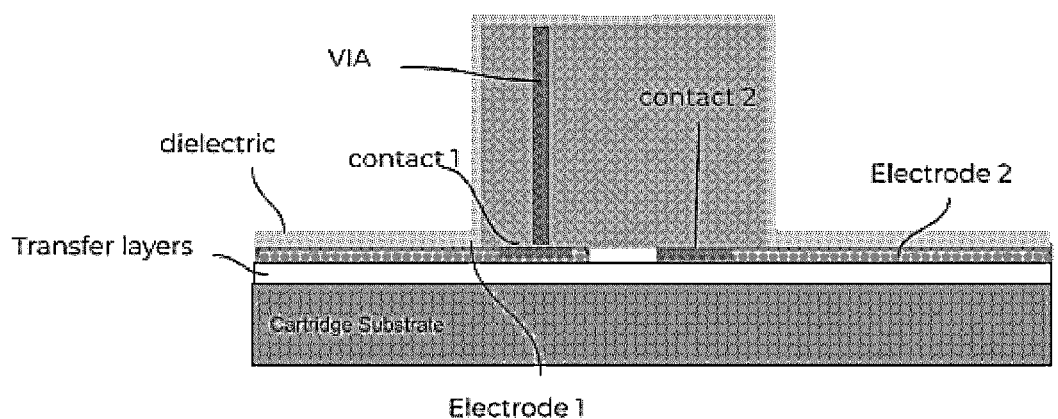
FIG. 3D shows another related example of the lateral with hidden contacts.

FIG. 3D shows another related example of the lateral with hidden contacts. Here the electrodes are formed on the bottom surface of the devices and patterned so they are coupled to each contact individually. The electrodes are coupled to the contact through opening in a dielectric layer on top of the contact. After forming the electrode on the surface (e.g. FIG. 3B) other layers such as membrane, anchors, release layer, force layer, buffer layers (called transfer layer) are formed. The devices are bonded to another substrate called cartridge substrate and the microdevice substrate is removed. The dielectric is open to provide access to the electrodes.

Figure 3E:
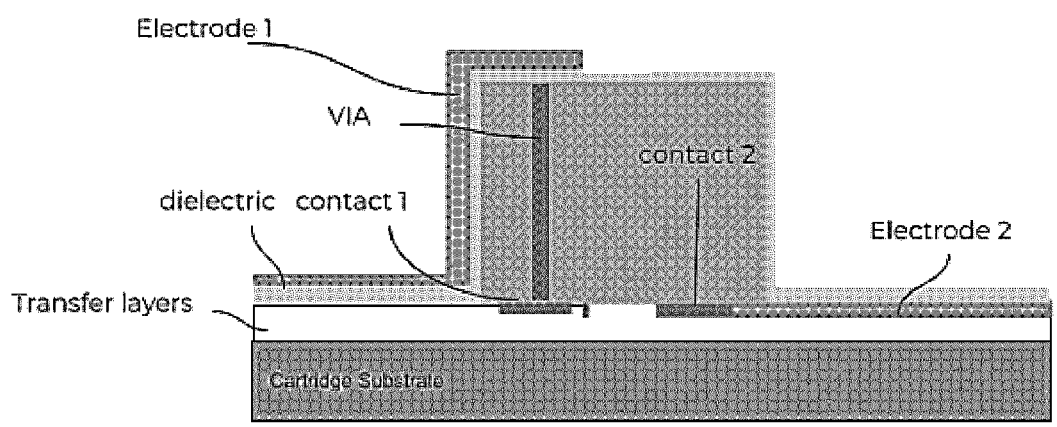
FIG. 3E shows an example of a lateral device where the electrodes to one contact is done through an accessible connection.

FIG. 3E is an example of a lateral device where the electrodes to one contact is done through an accessible connection. This is done through a VIA contact in the device. The benefit of this structure is that the two electrodes are more isolated through the dielectric layer. This can also allow forming rows and columns structure with electrodes which can enable more control on testing the devices (down to individual devices).

After the measurement is performed, the electrodes can be patterned or removed to isolate each microdevice.

Prior to the transfer of microdevices from cartridge to another substrate (system substrate), the release layer is removed. It can be done either chemically, thermally, or optically.

The foregoing description of one or more embodiments of the invention has been presented for the purposes of illustration and description. It is not intended to be exhaustive or to limit the invention to the precise form disclosed. Many modifications and variations are possible in light of the above teachings. It is intended that the scope of the invention be limited not by this detailed description, but rather by the claims appended hereto.

The invention claimed is:

1. A method of forming test electrodes for vertical microdevice, the method comprising:
    forming a microdevice on a microdevice substrate;
    the microdevice having a hidden contact on a surface facing away from the microdevice substrate;
    forming a protection layer to cover a part of the hidden contact;
    forming a dielectric layer to cover a surface of the microdevice and at least part of the microdevice sidewall, wherein the dielectric layer covers common layers that are on top of the microdevice substrate;
    forming an opening to provide access to the hidden contact; and
    forming a first electrode to provide access to the hidden contact outside of the microdevice.

2. The method of claim 1 wherein the hidden contact is a combination of an ohmic layer and a doped layer.

3. The method of claim 2 wherein the doped layer is either a p-doped layer or a n-doped layer.

4. The method of claim 1 wherein the first electrode can also act as a release layer.

5. The method of claim 1 wherein other layers can be formed on top of the first electrode as release layers.

6. The method of claim 1, wherein a housing is formed around the microdevice.

7. The method of claim 6, wherein microdevice substrate and common layers are removed.

8. The method of claim 7, wherein the microdevice is bonded to a donor substrate, and having a top contact facing away from the donor substrate.

9. The method of claim 8, the top contact of the device has an ohmic structure which is either a n-type or a p-type.

10. The method of claim 9, wherein a second electrode is formed providing access to the top contact.

11. The method of claim 10, wherein the second electrode is an n-electrode coupled to the top contact which has the n-type ohmic structure.

12. The method of claim 10, wherein the dielectric layer is formed on the top surface of the microdevice prior to the formation of the n-electrode or the n-type ohmic structure.

13. The method of claim 11 wherein an opening is formed providing access to the top contact or n-type ohmic structure.

14. The method of claim 11, wherein the electrodes for hidden contact and top contact are coupled to more than one microdevice.

15. The method of claim 11, wherein the electrodes form rows and columns.

16. The method of claim 11, wherein the electrodes form rows or columns.

17. The method of claim 11, wherein the dielectric layer is patterned providing access to hidden contact.

18. The method of claim 17, wherein a p-electrode is coupled to the hidden contact and n-electrode is coupled to the top contact.

19. A method of forming test electrodes for vertical microdevice, the method comprising:
    forming a microdevice on a microdevice substrate;
    the microdevice having a hidden contact on a surface facing away from the microdevice substrate;
    forming a protection layer to cover a part of the hidden contact;
    forming a dielectric layer to cover a surface of the microdevice and at least part of the microdevice sidewall;
    forming an opening to provide access to the hidden contact; and
    forming a first electrode to provide access to the hidden contact outside of the microdevice,
    wherein the microdevice also has an accessible contact and wherein transfer layers are formed after or at the same time as forming a second electrode to contact the hidden contact.

20. The method of claim 19, wherein the second electrode is formed and the transfer layers such as membrane, anchors, release layer, force layer, buffer layers are formed after the microdevice is separated from the microdevice substrate.

21. The method of claim 20, wherein the microdevice is bonded to a cartridge substrate.

* * * * *